(12) United States Patent
Shu et al.

(10) Patent No.: US 12,270,849 B2
(45) Date of Patent: Apr. 8, 2025

(54) OPTICAL MODULE WITH DETACHABLE OPTICAL PORT, AND TEST METHOD OF AOC OPTICAL MODULE

(71) Applicant: Wuhan HGGenuine Optics Tech Co., Ltd., Wuhan (CN)

(72) Inventors: Kun Shu, Wuhan (CN); Qijian Xu, Wuhan (CN)

(73) Assignee: Wuhan HGGenuine Optics Tech Co., Ltd., Wuhan (CN)

( * ) Notice: Subject to any disclaimer, the term of this patent is extended or adjusted under 35 U.S.C. 154(b) by 169 days.

(21) Appl. No.: 18/012,943

(22) PCT Filed: Jun. 11, 2021

(86) PCT No.: PCT/CN2021/099675
§ 371 (c)(1),
(2) Date: Dec. 26, 2022

(87) PCT Pub. No.: WO2022/257109
PCT Pub. Date: Dec. 15, 2022

(65) Prior Publication Data
US 2023/0266375 A1 Aug. 24, 2023

(30) Foreign Application Priority Data
Jun. 9, 2021 (CN) .......................... 202110643811.3

(51) Int. Cl.
*G01R 31/00* (2006.01)
*G02B 6/42* (2006.01)

(52) U.S. Cl.
CPC ......... *G01R 31/003* (2013.01); *G02B 6/4261* (2013.01); *G02B 6/4268* (2013.01); *G02B 6/428* (2013.01)

(58) Field of Classification Search
CPC .. G01R 31/003; G02B 6/4261; G02B 6/4268; G02B 6/428; G02B 6/3827; G02B 6/4286; G02B 6/4292; G02B 6/4269
(Continued)

(56) References Cited

U.S. PATENT DOCUMENTS 5,522,002 A    5/1996  Chun et al.
8,807,846 B2 * 8/2014  Hung ................. G02B 6/43
                                              385/88
(Continued)

FOREIGN PATENT DOCUMENTS

CN    201629746 U    11/2010
CN    110187457 A     8/2019
(Continued)

*Primary Examiner* — Christopher P McAndrew
(74) *Attorney, Agent, or Firm* — Womble Bond Dickinson (US) LLP

(57) ABSTRACT

An optical module with detachable optical port includes a module body and an optical port plastic part. The optical port of the module body is provided with a groove for inserting the optical port plastic part, and the optical port plastic part and the groove are detachably connected. A test method for an AOC optical module is provided, where the AOC optical module is the above-mentioned optical module with detachable optical port. According to the optical module with a detachable optical port, the detachable optical port plastic part can be disassembled and replaced independently without disassembling the module body, which can make this optical module scheme more convenient to change into the AOC module by replacing the plastic part of the optical port, and there is no need to re-do the performance test, which effectively improves the flexibility of the product scheme.

16 Claims, 3 Drawing Sheets

(58) Field of Classification Search
USPC .......................................................... 324/537
See application file for complete search history.

(56) References Cited

U.S. PATENT DOCUMENTS

| | | | |
|---|---|---|---|
| 2002/0018625 A1* | 2/2002 | Grann | G02B 6/29358 |
| | | | 385/24 |
| 2013/0004127 A1 | 1/2013 | McColloch | |
| 2013/0198414 A1 | 8/2013 | Julien et al. | |
| 2013/0230278 A1* | 9/2013 | Hung | G02B 6/4296 |
| | | | 385/14 |
| 2014/0186023 A1* | 7/2014 | Louderback | G02B 6/4293 |
| | | | 398/16 |
| 2016/0109667 A1* | 4/2016 | Cornelius | H04B 10/07955 |
| | | | 356/73.1 |
| 2017/0031108 A1* | 2/2017 | Gniadek | G02B 6/3891 |
| 2017/0285271 A1 | 10/2017 | Sipes, Jr. et al. | |
| 2020/0244364 A1 | 7/2020 | Jin et al. | |

FOREIGN PATENT DOCUMENTS

| | | |
|---|---|---|
| CN | 110611533 A | 12/2019 |
| CN | 110673271 A | 1/2020 |
| CN | 211086698 U | 7/2020 |
| CN | 211293367 U | 8/2020 |
| CN | 112415672 A | 2/2021 |
| CN | 212872987 U | 4/2021 |
| CN | 112799183 A | 5/2021 |

\* cited by examiner

OPTICAL MODULE WITH DETACHABLE OPTICAL PORT, AND TEST METHOD OF AOC OPTICAL MODULE

CROSS REFERENCE TO THE RELATED APPLICATIONS

This application is the national phase entry of International Application No. PCT/CN2021/099675, filed on Jun. 11, 2021, which is based upon and claims priority to Chinese Patent Application No. 202110643811.3, filed on Jun. 9, 2021, the entire contents of which are incorporated herein by reference.

TECHNICAL FIELD

The present invention relates to the optical module technology field, specifically, to an optical module with detachable optical port, and a test method of active optical cable (AOC) optical module.

BACKGROUND

Due to the short transmission distance of optical modules in data centers, most of them have a transmission distance of several hundred meters or tens of meters. Therefore, in the application scenarios of data centers, optical module products similar to short range-4 (SR4), SR8 or AOC products are mostly used. One of their outstanding features is that compared with the optical module with single-mode long-distance transmission, the cost requirements are more stringent. So, in actual production, the module manufacturer needs to strictly control the yield of SR series products. For the defective products of SR series, they can be transformed into AOC products for consumption through a relatively simple scheme.

Generally, in the production process of optical modules, for the module products that had been tested, if the main body of the module needs to be disassembled due to remodeling or other reasons, then all the test procedures need to be redone.

SUMMARY

One purpose of the present invention is to provide an optical module with detachable optical port, which effectively improves the flexibility of the product scheme and helps to reduce the cost of the product.

To achieve the above purpose, the embodiment of the present invention provides the following technical solutions: an optical module with detachable optical port, comprising: a module body and an optical port plastic part, the optical port of the module body is provided with a groove for inserting the optical port plastic part, the optical port plastic part and the groove are detachably connected.

Further, the module body comprises a base assembly and an upper cover covered on the base assembly, and the upper cover is provided with an optical port threaded hole for mounting an optical port screw to lock the optical port plastic part.

Further, the module body also includes a printed circuit board (PCB) board, the PCB board is arranged on the base assembly and is pressed on the base assembly by the upper cover.

Further, the module body also includes an internal jumper, and the internal jumper is connected to the PCB board.

Further, the module body also includes a thermal pad, and the thermal pad is arranged between the upper cover and the base assembly.

Further, the base assembly comprises a base, and a handle that can be pulled to unlock the optical module, and the groove is arranged on the base and the upper cover near the optical port.

Further, the handle comprises a hand lever arranged at the optical port of the base and an unlocking latch that can slide on the side of the base.

Further, the base assembly also includes a spring for resetting after unlocking.

Further, the upper cover is provided with a dispensing slot for installing conductive adhesive.

The embodiment of the present invention also provides the following technical solution: a test method for AOC optical module, wherein the AOC optical module is the above-mentioned optical module with detachable optical port, and specifically comprises the following test steps:

S1, take the optical port plastic part out of the groove;

S2, without disassembling the module body, remove the tail fiber of the AOC optical module, and then install the optical port plastic part of the SR optical module at the detachable optical port, at this time, the AOC optical module can be transformed into an SR optical module;

S3, connect the SR optical module with the self loop optical fiber for electrical ageing test;

S4, after the electrical ageing test is completed and qualified, the self-loop optical fiber is removed, and the tail fiber and the optical port plastic part are installed to complete the test.

Compared with the prior art, the invention has the following beneficial effects: An optical module with detachable optical port, the detachable optical port plastic part can be disassembled and replaced independently without disassembling the module body, which can make this optical module scheme more convenient to change into the AOC module by replacing the plastic part of the optical port, and there is no need to re-do the performance test, which effectively improves the flexibility of the product scheme and helps to reduce the cost of the product.

Figure 1:
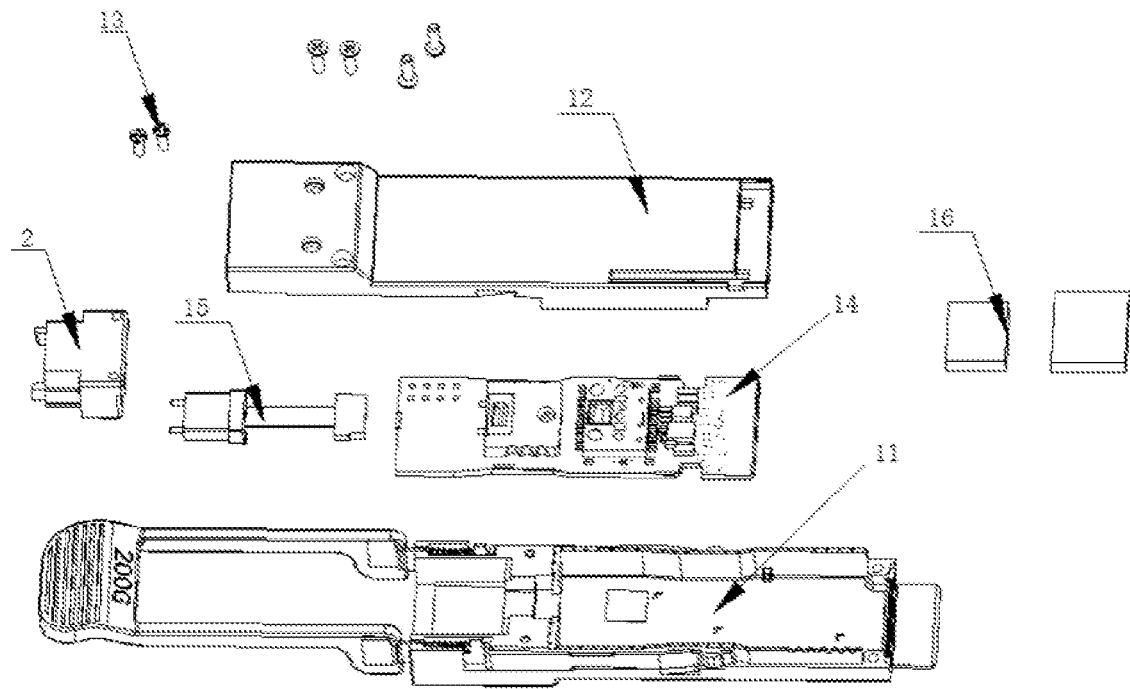
FIG. 1 shows the exploded view of an optical module with detachable optical port according to an embodiment of the present invention.

In the drawings, 1 is the module body, 10 is the groove, 11 is the base assembly, 12 is the upper cover, 120 is the dispensing slot, 121 is the threaded hole, 13 is the optical port screw, 130 is the optical port threaded hole, 14 is the PCB board, 15 is the internal jumper, 16 is the thermal pad, 17 is the base, 18 is the handle, 180 is the hand lever, 181 is the unlocking latch, 182 is the spring mounting position, 19 is the spring, 2 is the optical port plastic part, 3 is the AOC optical module, 30 is the tail fiber.

DETAILED DESCRIPTION OF THE EMBODIMENTS

The technical scheme in the embodiments of the present invention will be clearly and completely described below in combination with the accompanying drawings in the embodiments of the present invention. Obviously, the described embodiments are only a part of the present invention, not all of the embodiments. Based on the embodiments of the present invention, all other embodiments obtained by one of ordinary skill in the art without creative work shall fall within the protection scope of the present invention.

Figure 2:
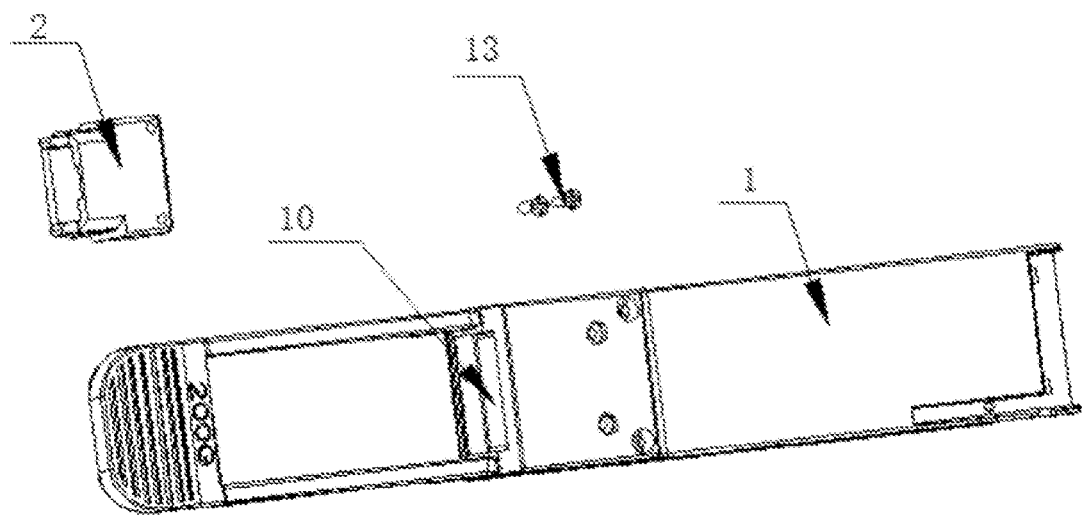
FIG. 2 shows the schematic diagram of the cooperation between the optical port plastic part and the module body of an optical module with detachable optical port according to an embodiment of the present invention.
Figure 3:
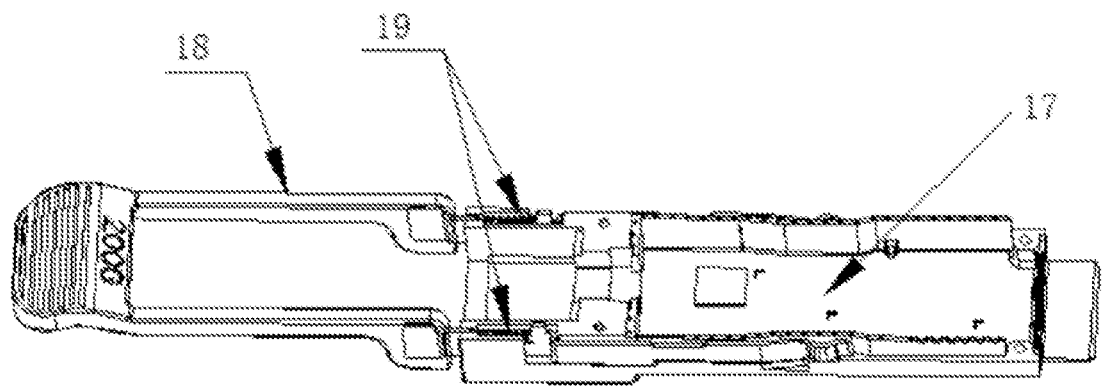
FIG. 3 shows the schematic diagram of the base assembly of an optical module with detachable optical port according to an embodiment of the present invention.
Figure 4:
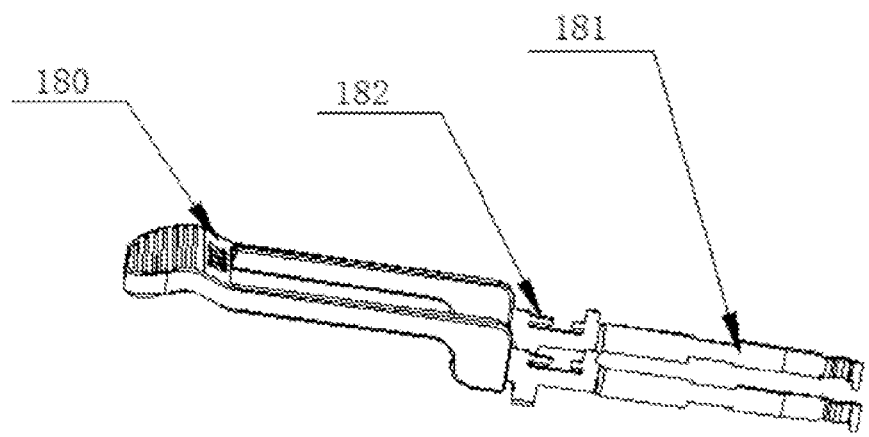
FIG. 4 shows the schematic diagram of the handle of an optical module with detachable optical port according to an embodiment of the present invention.
Figure 5:
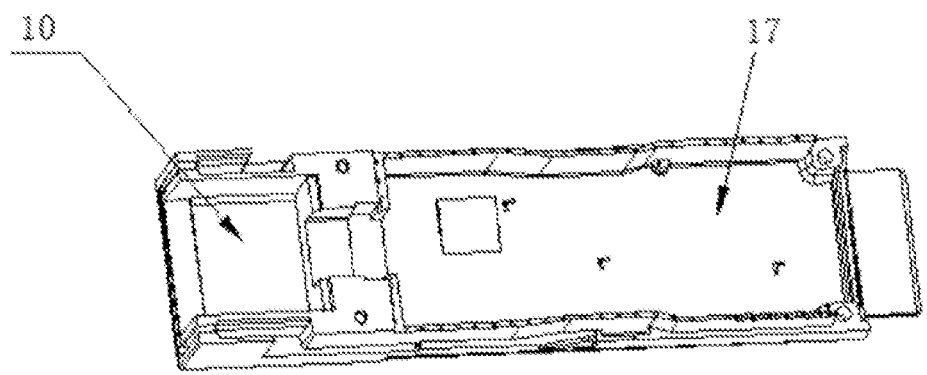
FIG. 5 shows the schematic diagram of the base of an optical module with detachable optical port according to an embodiment of the present invention.

Refer to FIG. 1, FIG. 2, and FIG. 5, the embodiment of the present invention provides an optical module with detachable optical port, comprising: a module body 1 and an optical port plastic part 2, the optical port of the module body 1 is provided with a groove 10 for inserting the optical port plastic part 2, the optical port plastic part 2 and the groove 10 are detachably connected. In this embodiment, the detachable optical port plastic part 2 can be disassembled and replaced independently without disassembling the main body of the module, which can make this optical module scheme more convenient to change into the AOC module by replacing the plastic part of the optical port, and there is no need to re-do the performance test, which effectively improves the flexibility of the product scheme and helps to reduce the cost of the product. Specifically, a groove 10 is provided in the module body 1 near the optical port, and the optical port plastic part 2 can be inserted into the groove 10, since the optical port plastic part 2 and the groove 10 are detachably connected, the optical port plastic part 2 can be taken out from the groove 10 when needed, so that the optical module can be transformed into an AOC module by replacing the plastic parts of the optical port without disassembling the module body 1.

As an optimized solution of the embodiment of the present invention, please refer to FIG. 1, FIG. 2, FIG. 3, FIG. 5, FIG. 6 and FIG. 7, the module body 1 comprises a base assembly 11 and an upper cover 12 covered on the base assembly 11, and the upper cover 12 is provided with an optical port threaded hole 130 for mounting an optical port screw 13 to lock the optical port plastic part 2. The module body 1 also includes a PCB board 14, the PCB board 14 is arranged on the base assembly 11 and is pressed on the base assembly 11 by the upper cover 12. The module body 1 also includes an internal jumper 15, and the internal jumper 15 is connected to the PCB board 14. The module body 1 also includes a thermal pad 16, and the thermal pad 16 is arranged between the upper cover 12 and the base assembly 11. In this embodiment, the internal jumper 15, the upper cover 12, the thermal pad 16, the PCB board 14, the COB assembly and the base assembly 11 constitute the module body 1, wherein the upper cover 12 is provided with an optical port threaded hole 130, after the optical port plastic part 2 is inserted into the groove 10, the optical port screw 13 can be installed from here to lock the optical port plastic part 2. When it needs to be disassembled, just unscrew the optical port screw 13. Of course, the way of detachable connection is not limited to the screw fixation method, and there may also be ways such as clamping, magnetic connection, etc., which are not limited in this embodiment. The PCB board 14 and the internal jumper 15 are conventional components in the art, and will not be described in detail here. Disposing thermal pad 16 in the upper cover 12 and the base assembly 11 can improve the heat dissipation capability of the optical module.

As an optimized solution of the embodiment of the present invention, please refer to FIG. 1 to FIG. 4, the base assembly 11 comprises a base 17, and a handle 18 that can be pulled to unlock the optical module, and the groove 10 is arranged on the base 17 and the upper cover 12 near the optical port. The handle 18 comprises a hand lever 180 arranged at the optical port of the base 17 and an unlocking latch 181 that can slide on the side of the base 17. The base assembly 11 also includes a spring 19 for resetting after unlocking. The handle 18 is provided with the spring mounting position 182 for mounting the spring 19. In this embodiment, part of the groove 10 is on the upper cover 12 and part is on the base 17, and the combination of the two is the groove 10. The optical module can be unlocked by the handle 18, specifically, the handle 18 includes two parts, one is the hand lever 180 and the other is the unlocking latch 181, and the side wall of the base 17 is provided with a guide groove for the unlocking latch 181 to slide on it. When the handle 18 is pulled back, the finger at the end of the unlocking latch 181 away from the hand lever 180 can be disengaged from the cage, thereby completing the unlocking. After the spring 19 is set, the unlocking latch 181 can be rebounded to the initial state by the elasticity of the spring 19 after the unlocking is completed. A spring mounting position 182 for mounting the spring 19 is provided on the handle 18 to facilitate the mounting of the spring 19.

Figure 6:
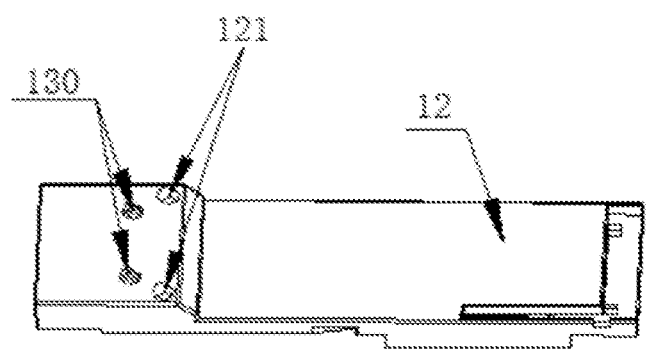
FIG. 6 shows the schematic diagram of a first perspective view of the upper cover of an optical module with detachable optical port according to an embodiment of the present invention.
Figure 7:
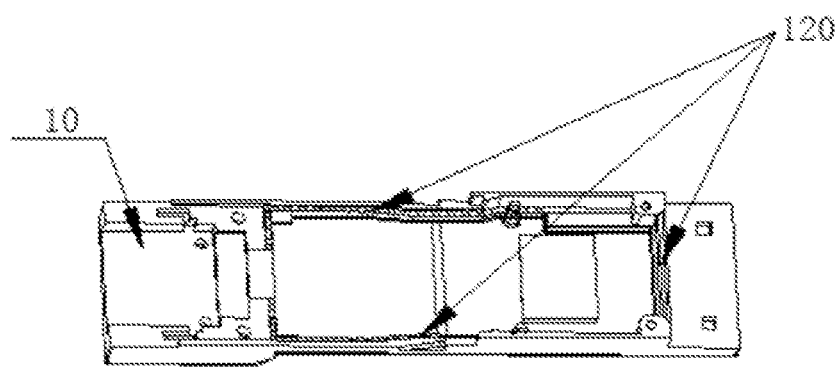
FIG. 7 shows the schematic diagram of a second perspective view of the upper cover of an optical module with detachable optical port according to an embodiment of the present invention.
Figure 8:
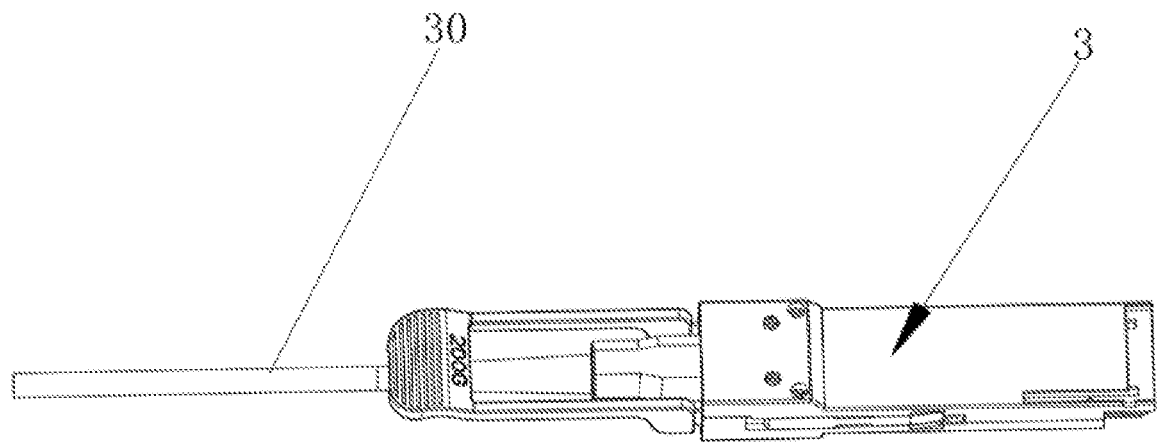
FIG. 8 shows the schematic diagram of an AOC optical module according to an embodiment of the present invention.

As an optimized solution of the embodiment of the present invention, please refer to FIG. 6 and FIG. 7, the upper cover 12 is provided with a dispensing slot 120 for installing conductive adhesive. In this embodiment, the upper cover 12 has threaded holes 121, into which screws can be screwed to connect the upper cover 12 and the base 17. The positions of the threaded holes can be set at different positions as long as the upper cover 12 and the base 17 can be connected together. The flexible conductive glue can be set in the dispensing slot 120, and the fitting gap between the upper cover 12 and the base 17 can be sealed by tightening the screw pressure.

Please refer to FIG. 1 to FIG. 8, the embodiment of the present invention also provides a test method for AOC optical module, wherein the AOC optical module 3 is the above-mentioned optical module with detachable optical port, specifically comprises the following test steps:

S1, take the optical port plastic part out of the groove;

S2, without disassembling the module body, remove the tail fiber of the AOC optical module, and then install the optical port plastic part of the SR optical module at the detachable optical port, at this time, the AOC optical module can be transformed into an SR optical module;

S3, connect the SR optical module with the self loop optical fiber for electrical ageing test;

S4, after the electrical ageing test is completed and qualified, the self-loop optical fiber is removed, and the tail fiber and the optical port plastic part are installed to complete the test.

In this embodiment, when the AOC optical module 3 is tested using the technical solution of the detachable optical port of the optical module, it is only necessary to take out the optical port plastic part 2 from the groove 10, and then the tail fiber 30 can be taken out without disassembling the module body 1, and the optical module can be transformed into an SR optical module, then, it is easy to configure the self-loop fiber for the SR optical module for electrical ageing test. After the electrical ageing test, if it is qualified, remove the self-loop fiber, and install the tail fiber 30 and the optical port plastic part 2, the test can be completed. The length of the tail fiber 30 of the existing AOC optical module 3 is very long, generally 5-20 meters, and can even be made longer as required. The volume of the entire product is much larger than that of ordinary optical module products. Therefore, during the electrical ageing test, the requirements for the volume of the equipment will increase exponentially. Generally, a test box can test many small optical modules at one time, but due to the large size of the AOC optical module 3, one box may not be able to be put down, and only one or two may be tested after coiling the optical fiber, which is a serious challenge for the aging process, during the electrical ageing process, if the inside of the aging box is not clean enough, it is easy to make the optical cable dirty and affect the appearance of the product and cause defects. Therefore, in this embodiment, through the form of the above-mentioned detachable optical port, the tail fiber 30 can be easily taken down and replaced with an SR optical module without removing the upper cover, so as to carry out the electrical ageing test, the size of the self loop optical fiber is much smaller, which can improve the efficiency of the test. The industry standard of optical module is that after the optical module completes the performance test, it is not necessary to re-test the optical module after replacing some parts without disassembling the main body of the module. This can effectively solve the problem of insufficient resources of aging equipment and the problem of cable contamination in the aging process.

Although embodiments of the invention have been shown and described, it can be understood for those skilled in the art that various changes, modifications, substitutions and modifications can be made to these embodiments without departing from the principles and spirit of the invention, the scope of the present invention is defined by the appended claims and their equivalents.

What is claimed is:

1. An optical module with a detachable optical port, comprising:
   a module body; and
   an optical port plastic part, wherein the detachable optical port of the module body is provided with a groove for inserting the optical port plastic part, and the optical port plastic part and the groove are detachably connected, and wherein the module body comprises a base assembly and an upper cover on the base assembly, and the upper cover is provided with an optical port threaded hole for mounting an optical port screw to lock the optical port plastic part.

2. The optical module with the detachable optical port according to claim 1, wherein the module body further comprises a printed circuit board (PCB) board, wherein the PCB board is arranged on the base assembly, and the PCB board is pressed on the base assembly by the upper cover.

3. The optical module with the detachable optical port according to claim 2, wherein the module body further comprises an internal Jumper, and the internal Jumper is connected to the PCB board.

4. The optical module with the detachable optical port according to claim 1, wherein the module body further comprises a thermal pad, and the thermal pad is arranged between the upper cover and the base assembly.

5. The optical module with the detachable optical port according to claim 1, wherein the base assembly comprises a base and a handle, wherein the handle is configured to be pulled to unlock the optical module, and the groove is arranged on the base and the upper cover adjacent to the detachable optical port.

6. The optical module with the detachable optical port according to claim 5, wherein the handle comprises a hand lever and an unlocking latch, wherein the hand lever is arranged at the detachable optical port of the base, and the unlocking latch is configured to slide on a side of the base.

7. The optical module with the detachable optical port according to claim 5, wherein the base assembly further comprises a spring for resetting after unlocking.

8. The optical module with the detachable optical port according to claim 1, wherein the upper cover is provided with a dispensing slot for installing conductive adhesive.

9. A test method for an active optical cable (AOC) optical module, comprising:
   taking an optical port plastic part out of a groove, wherein the AOC optical module is an optical module with a detachable optical port, the optical module with the detachable optical port comprising a module body and the optical port plastic part, wherein the detachable optical port of the module body is provided with the groove for inserting the optical port plastic part, and the optical port plastic part and the groove are detachably connected, and wherein the module body comprises a base assembly and an upper cover on the base assembly, and the upper cover is provided with an optical port threaded hole for mounting an optical port screw to lock the optical port plastic part;
   without disassembling the module body, removing a tail fiber of the AOC optical module, and then installing the optical port plastic part of a short range (SR) optical module at the detachable optical port, wherein the AOC optical module is configured to be transformed into the SR optical module;
   connecting the SR optical module with a self-loop optical fiber for an electrical ageing test; and
   after the electrical ageing test is completed and qualified, removing the self-loop optical fiber, and installing the tail fiber and the optical port plastic part to complete a test.

10. The test method according to claim 9, wherein in the optical module, the module body further comprises a PCB board, wherein the PCB board is arranged on the base assembly, and the PCB board is pressed on the base assembly by the upper cover.

11. The test method according to claim 10, wherein in the optical module, the module body further comprises an internal Jumper, and the internal Jumper is connected to the PCB board.

12. The test method according to claim 9, wherein in the optical module, the module body further comprises a thermal pad, and the thermal pad is arranged between the upper cover and the base assembly.

13. The test method according to claim 9, wherein in the optical module, the base assembly comprises a base and a handle, wherein the handle is configured to be pulled to unlock the optical module, and the groove is arranged on the base and the upper cover adjacent to the detachable optical port.

14. The test method according to claim 13, wherein in the optical module, the handle comprises a hand lever and an unlocking latch, wherein the hand lever is arranged at the detachable optical port of the base, and the unlocking latch is configured to slide on a side of the base.

15. The test method according to claim 13, wherein in the optical module, the base assembly further comprises a spring for resetting after unlocking.

16. The test method according to claim 9, wherein in the optical module, the upper cover is provided with a dispensing slot for installing conductive adhesive.

* * * * *